United States Patent [19]

Kamikawa

[11] Patent Number: 5,369,891
[45] Date of Patent: Dec. 6, 1994

[54] SUBSTRATE DRYING APPARATUS

[75] Inventor: Yuuji Kamikawa, Kumamoto, Japan

[73] Assignees: Tokyo Electron Limited, Tokyo; Tokyo Electron Kyushu Limited, Tosu, both of Japan

[21] Appl. No.: 111,006

[22] Filed: Aug. 24, 1993

[30] Foreign Application Priority Data

Aug. 24, 1992 [JP] Japan .................................. 4-223932

[51] Int. Cl.⁵ .............................................. F26B 21/06
[52] U.S. Cl. .......................................... 34/78; 34/470; 34/77
[58] Field of Search ............... 34/78, 77, 27, 467, 34/468, 469, 470, 72–78

[56] References Cited

U.S. PATENT DOCUMENTS

| | | | |
|---|---|---|---|
| 4,079,522 | 3/1978 | Ham | 34/68 |
| 4,628,616 | 12/1986 | Shirai et al. | 34/78 |
| 4,776,105 | 10/1988 | Mishina et al. | 34/78 |
| 4,841,645 | 6/1989 | Bettcher et al. | 34/78 |
| 5,038,496 | 8/1991 | Mishina et al. | 34/78 |

FOREIGN PATENT DOCUMENTS 63-160231 7/1988 Japan .

Primary Examiner—Denise L. Gromada
Attorney, Agent, or Firm—Oblon, Spivak, McClelland, Maier, & Neustadt

[57] ABSTRACT

A substrate drying apparatus comprising a vessel in which IPA is contained, a chamber enclosing the vessel, a heating heater for heating IPA into vapor in the vessel and in that region in the vessel where a plurality of substrates are vapor-processed, a mechanism for carrying the plural water-washed substrates into the vapor-processing region in the vessel, a mechanism located above the vapor-processing region in the vessel to cool the IPA vapor into solution drops, region in the chamber located above the cooling mechanism where the substrates can be dried while removing IPA from the substrates, and gas supply and exhaust devices for causing gas to flow from above to below in the drying region in the chamber.

13 Claims, 5 Drawing Sheets

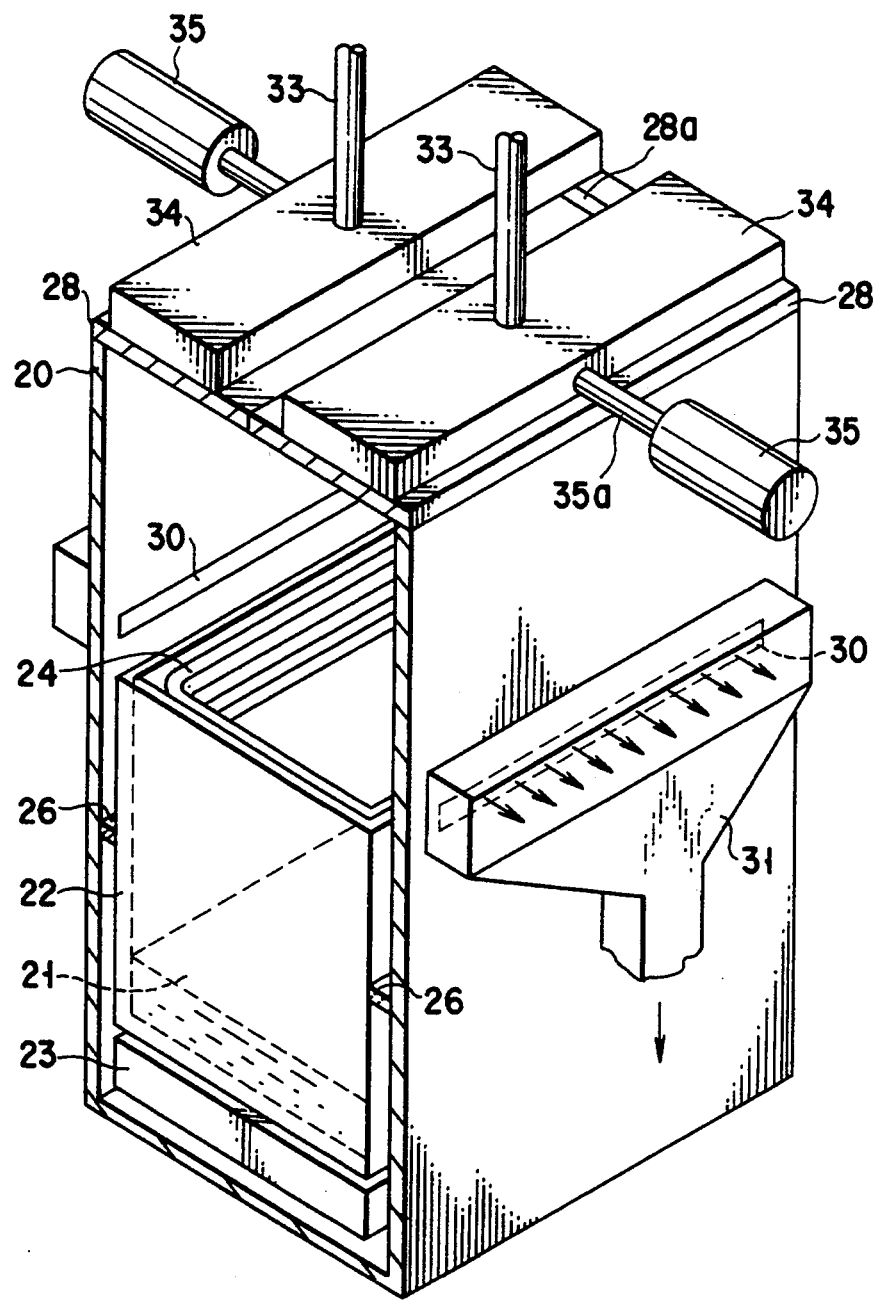
F I G. 3

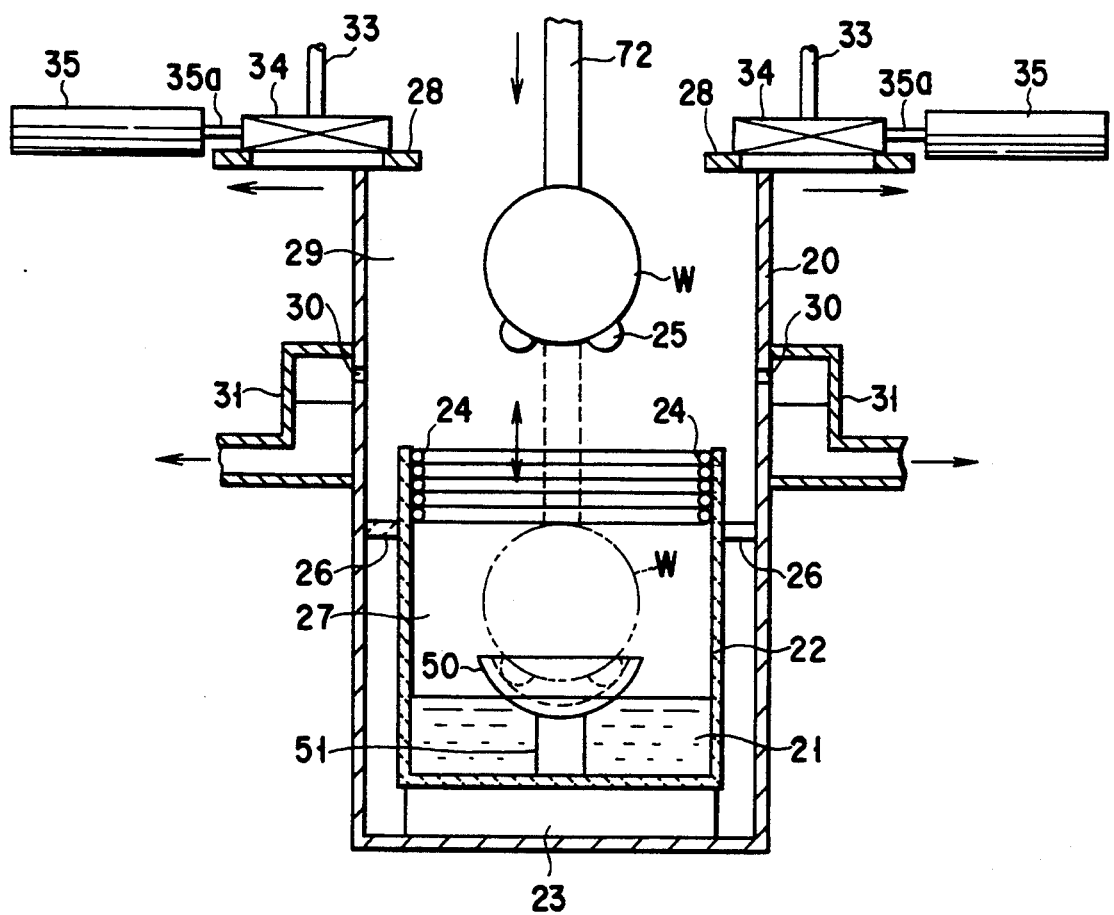
F I G. 4

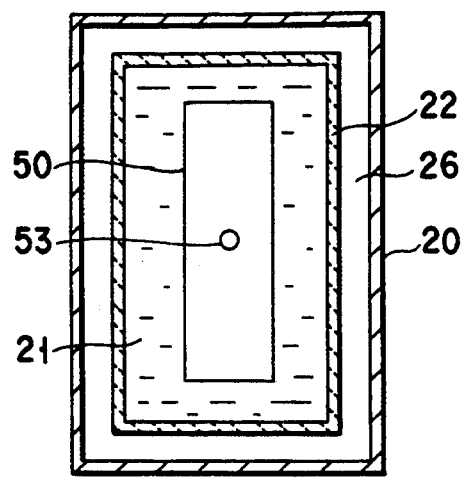
F I G. 5
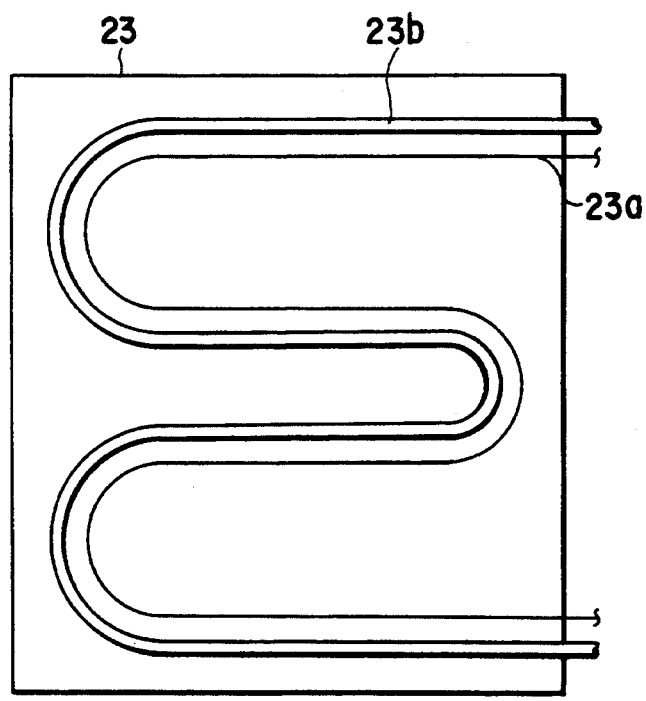
F I G. 6

SUBSTRATE DRYING APPARATUS

BACKGROUND OF THE INVENTION

1. Field of the Invention

The present invention relates to an apparatus for drying plural sheets of wet substrates such as semiconductor wafers.

2. Description of the Related Art

In the course of manufacturing semiconductor devices, there has been widely used the cleaning system wherein semiconductor wafers, LCD glass substrates and others are dried while successively immersing them in those process vessels in which either cleaning or rinsing solution is contained.

The cleaning system of this type uses the substrate drying apparatus in which the vapor of IPA (isopropyl alcohol), for example, is applied to those matters such as semiconductor wafers, which must be dried, to remove water content from them so as to dry them.

In the case of this conventional substrate drying apparatus, the drying of semiconductor wafers, for example, is usually carried out in such a way that IPA, for example, contained in the process vessel is heated into vapor, that the IPA vapor is condensed on surfaces of semiconductor wafers located above the process vessel to remove water content from them and that they are taken out into the atmosphere to evaporate the IPA.

Japanese Patent Disclosure She 63-160231 discloses a substrate drying apparatus wherein a space (or drying section) in which semiconductor wafers, for example, can be housed is provided above the vapor-processing section in which IPA vapor is applied to semiconductor wafers. In the case of this substrate drying apparatus, wafers are located in the drying section to dry IPA which has adhered to wafers. Dusts and particles are thus prevented from adhering to those wafers which are being dried.

In the case of this substrate drying apparatus, a cooling mechanism is also provided between the IPA-vapor applying section and the drying section to cool and condense IPA vapor. A dry gas supply mechanism is also provided to jet dry gas through side walls of the apparatus which are located between the vapor-processing section and the drying section. The dry gas flow thus created and the cooling mechanism cooperate to prevent IPA vapor, for example, from rising from the vapor-processing section and entering into the drying section.

In the case of the above-described conventional substrate drying apparatus, however, dry gas is jetted through side walls of the apparatus between the vapor-processing section and the drying section. IPA vapor in the vapor-processing section is thus raised up by the flow of dry gas and enters into the drying section to delay the drying of semiconductor wafers, for example, in it and to be leaked outside the apparatus.

SUMMARY OF THE INVENTION

The object of the present invention is therefore to provide a substrate drying apparatus capable of preventing vapor in the vapor-processing section from entering into the drying section and being leaked outside the apparatus, making the drying time shorter to enhance the throughput to greater extent, and having a higher safety.

According to an aspect of the present invention, there can be provided a substrate drying apparatus comprising a vessel in which a drying solution is contained; a chamber enclosing the vessel; means for heating the drying solution into vapor in the chamber in order to form a vapor-processing region where substrates are wetted with a washing solution are processed with the vapor; means for carrying the wet substrates into the vapor-processing region in the vessel; means located above the vapor-processing region in the vessel to cool and condense the vaporized drying solution into solution drops; a region in the chamber located above the cooling means where the substrate can be dried while removing the drying solution from the substrates and; means for causing gas to flow from above to below in the drying region in the chamber.

Additional objects and advantages of the invention will be set forth in the description which follows, and in part will be obvious as from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a perspective view showing the main portion of the substrate drying apparatus party cut away;

FIG. 4 is a sectional view showing the main portion of the substrate drying apparatus cut away;

FIG. 5 is a plan showing the main portion of the substrate drying apparatus cut away; and FIG. 6 is a plan showing a lower heater mechanism.

DETAILED DESCRIPTION OF THE PREFERRED EMBODIMENTS

The substrate drying apparatus according to an embodiment of the present invention will be described in detail with reference to the accompanying drawings.

Figure 1:
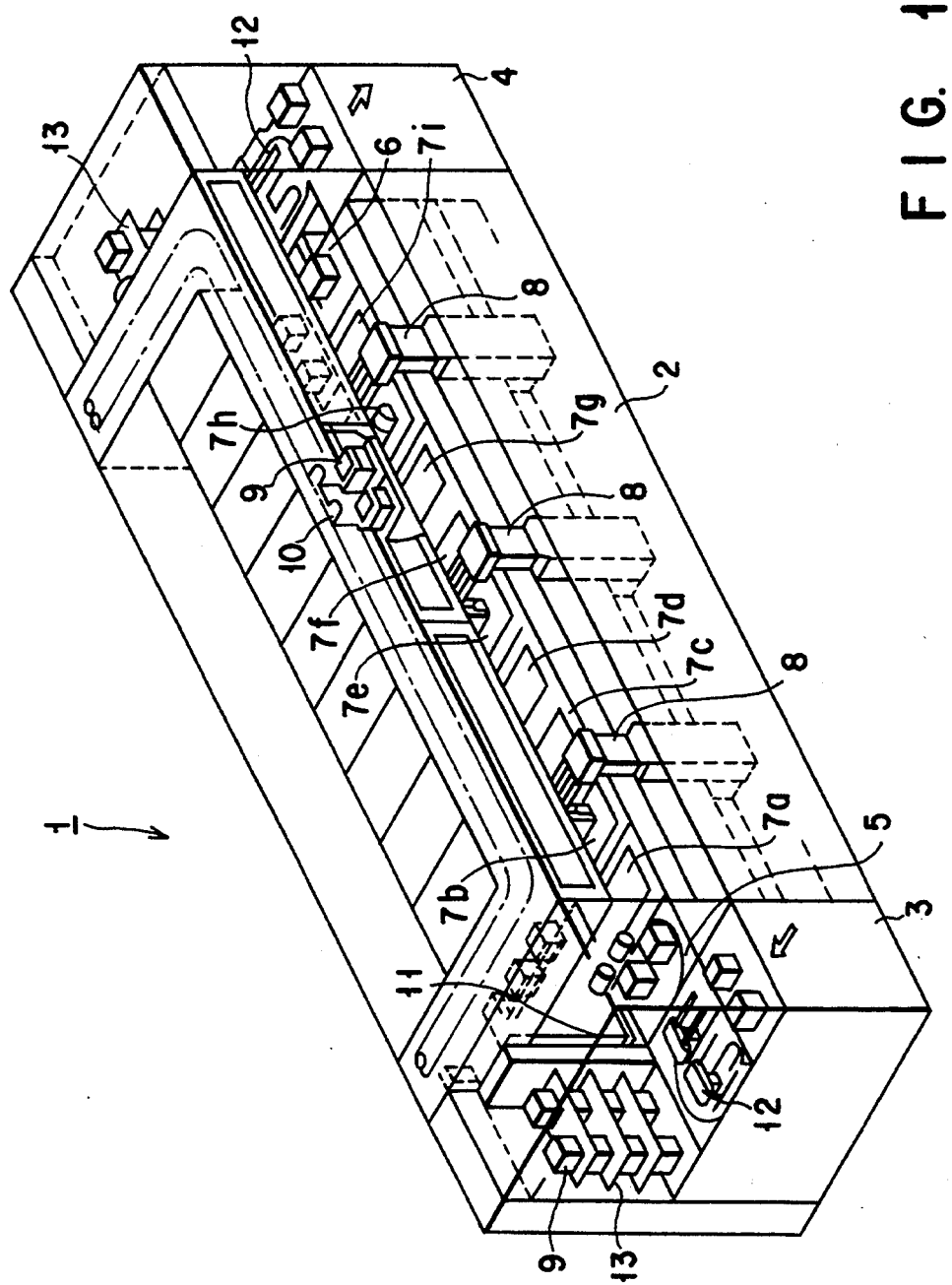
FIG. 1 is a perspective view showing the cleaning system.

As shown in FIG. 1, a cleaning system 1 includes cleaning, input and output buffer sections 2, 3, and 4. The input and output buffer sections 3 and 4 are located adjacent to both ends of the cleaning section 2.

Loader and unloader sections 5 and 6 are located at both ends of the cleaning section 2. A mechanism 10 for carrying empty wafer cassettes 9 is arranged to run from above the loader section 5 to above the unloader section 6, passing over each of carrier mechanisms 8. A cassette lifter 11 for lifting and lowering empty cassettes 9 is arranged in each of the loader and unloader sections 5 and 6.

Nine process mechanisms 7a–7i are arranged in a line between the loader 5 and the unloader section 6. Wafer chuck cleaning and drying, wafer chemical-solution-cleaning, wafer water-washing, wafer water-washing, wafer chemical-solution-cleaning, wafer water-washing, wafer water-washing, wafer chuck cleaning and drying, and wafer drying mechanisms 7a, 7b, 7c, 7d, 7e, 7f, 7g, 7h and 7i are arranged in this order when viewed from the side of the loader section 5. The present invention relates to the last wafer drying mechanism 7j.

The carrier mechanisms 8 are arranged to run along these process mechanisms 7a–7i so as to carry wafers W in and out between the loader (or unloader) section 5 or 6 and each of the process mechanisms 7a–7i. In other words, fifty sheets of semiconductor wafers w are held together and carried in vertical and horizontal directions by a wafer chuck of each carrier mechanism 8. Three carrier mechanisms 8 are provided in this case and each carrier mechanism 8 has its independent moving range to prevent chemical solution in the process mechanism 7b from being mixed with the one in the other process mechanism 7e.

Figure 2:
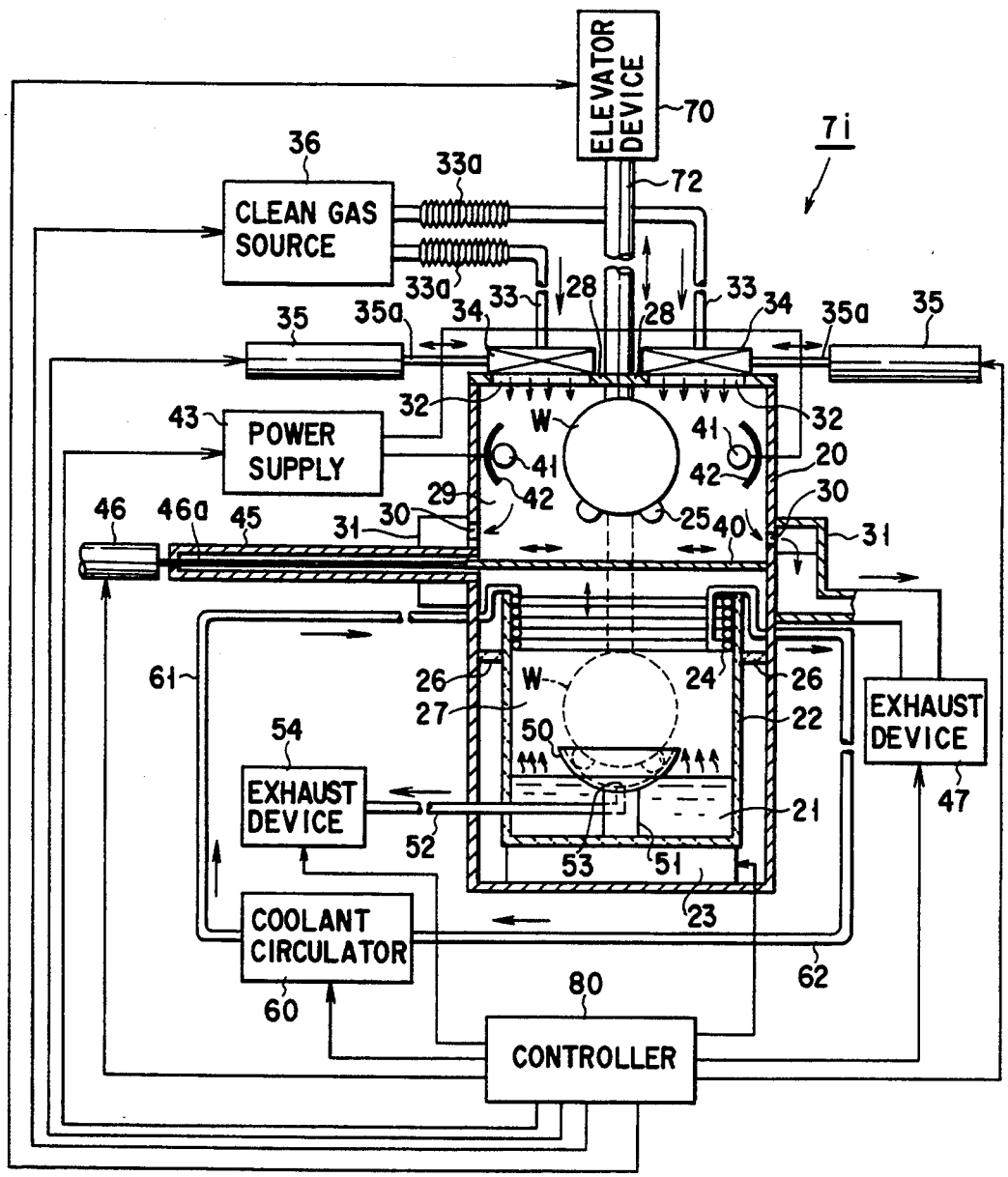
FIG. 2 is a sectional view showing the substrate drying apparatus according to first embodiment of the present invention, said substrate drying apparatus being shown like a block diagram and its main portion being cut away in this case.

As shown in FIG. 2, the substrate drying apparatus 7i has a case (or chamber) 20 made of stain less steel and a quartz-made vessel 22 is housed in the lower portion of the case 20. Isopropyl alcohol (IPA) 21 is contained, as drying solution, in the vessel 22. The case 20 and vessel 22 are shaped like a box and the top of the case 20 is closed by a pair of top lids 28, while the top of the vessel 22 is left open. Each of the top lids 28 is provided with an opening 32 in which a filter 34 is arranged. Clean gas is supplied from a pure gas supply source 36 into the case 20 (or into an upper portion 29 of the case 20) through the filters 34. Dry air or dry nitrogen gas is contained in the pure gas supply source 36.

Slits 30 are formed in those side walls of the case 20 which are opposed to each other, and the upper portion 29 of the case 20 is exhausted through these paired slits 30. The slits 30 are communicated with an exhaust device 47 through passages 31. The exhaust device 47 is further communicated with an exhaust duct (not shown) in the factory. When pure gas is introduced into the case 20 through the top openings 32 and the case 20 is exhausted through the slits 30, a down flow of pure gas is caused in the upper portion 29 of the case 20. Each of the exhaust passages 31 is made narrow as it comes nearer to its lower portion, as shown in FIG. 3.

Plural heating lamps 41 are arranged between the paired top top lids 28 and the slits 30 to heat and dry those wafers W which are being passed through the upper portion 29 of the case 20. Each heating lamp 41 is backed up by a reflector plate 42 and connected to a power source 43. An infrared lamp is used as the heating lamp 41. It may be arranged that jetting nozzles are used, instead of the heating lamps 41, to blow dry air to the wafers W. It may also be arranged that heating means is provided, instead of the heating lamp 41, on the way of each gas supply pipe 33 to heat clean dry gas which passes through the gas supply pipe 33.

As shown in FIGS. 3 and 4, the top lids 28 are slid left and right by air cylinders 35 to open and close the open top of the case 20. In short, cylinder rods 35a are connected to filter cases to slide the top lids 28 together with the filters 34 in the horizontal direction. A flexible portion 33a is provided at an appropriate position of each pure gas supply pipe 33 to follow the opening and closing behaviors of each top lid 28. SiO2 fibers are used as elements for the filter 34.

Fifty sheets of wafers W are held on a boat 25, which is supported by an elevator device 70 through a support rod 72. When the boat 25 is introduced into the case 20 and the case 20 is closed by the top lids 28, the support rod 72 is held freely in a small opening 28a not to interfere with the top lids 28 of the case The lower portion of the case 20 and the vessel 22 will be described below.

The vessel 22 is mounted on a heating mechanism 23, by which the bottom of the vessel 22 is heated. When the bottom of the vessel 22 is heated in this manner, vapor of IPA is created to fill an inner region 27 of the vessel 22.

A receiving cup 50 is arranged on the bottom of the vessel 22. The top of the receiving cup 50 is held higher than the top of IPA solution 21. The receiving cup 50 is intended to receive the plural wafers W held on the horizontal type boat 25, and it is fixed to and supported on the bottom of the vessel 22 by a post 51. A drain 53 is opened in the curved bottom of the receiving cup 50 and communicated with an exhaust device 54 through en exhaust passage 52. Solution drops adhering to the wafers W are removed by IPA vapor and exhausted outside through the drain 53. It is preferable that the distance by which the cup 50 is separated from the top lids 28 is in a range of 400–600 mm.

As shown in FIG. 5, the receiving cup 50 is shaped to have a length and a width enough to receive therein the horizontal type boat 25. The drain 53 is formed substantially in the center of the bottom of the cup 50. A partition 26 is arranged between the vessel 22 and the case 20, enclosing the vessel 22. The inner region 27 of the vessel 22 is shielded from outside by the partition 26 which is made of quartz.

A pipe 24 extends along the upper inner wall of the vessel 22. Cooling water is circulated through the pipe 24 via supply and return pipes 61 and 62 by a coolant circulator 60. IPA vapor is cooled and condensed in the upper portion of the vessel 22 and returned, as solution drops, into the vessel 22. In short, it is made difficult for IPA vapor in the inner region 27 of the vessel 22 to leak outside.

As shown in FIG. 2, a shutter 40 is arranged just above the vessel 22 to shield the inner region 27 of the vessel 22 (or the lower portion of the case 20) from the upper portion 29 of the case 20. The shutter 40 is located just under the slits 30 to define the volume of the upper portion 29 of the case 20. This enables the wafers W to be more quickly dried in the upper portion 29 of the case 20. The shutter 40 is connected to a rod 46a of air cylinder 46 and when the rod 46a is retreated, the shutter 40 is housed in a housing section 45 while when it is extended, the shutter 40 partitions the case 20 into upper and lower portions. The shutter 40 is made by a fluoroplastics-coated stainless steel plate. The shutter 40 is not essential but optional.

As shown in FIG. 6, the heating mechanism 23 is a plate heater having a resistant heating element 23a. A coolant circulating pipe 23b is arranged along the resistant heating element 23a. The bottom of the vessel 22 can be temperature-adjusted with a higher accuracy, while introducing coolant such as cooling water into the coolant circulating pipe 23b.

The heating mechanism 23, cylinders 35, 46, pure gas supply source 36, exhaust devices 47, 54, coolant circulator 60 and elevator device 70 can be operation-controlled by a controller 80. A predetermined recipe is stored in the memory of this controller 80.

It will be described how the semiconductor wafers W can be dried by the above-described substrate drying apparatus 7i.

IPA 21 in the vessel 22 is heated to temperature of 150°–200° C. by the heating means 23 and the inner region 27 of the vessel 22 is thus previously filled with IPA vapor before the wafers W are introduced into the case 20. The boiling point of IPA 21 is about 80° C. The top lids 28 are opened and fifty sheets of wafers W are lowered together with the boat 25 into the inner region 27 of the vessel 22. The top lids 28 are then closed. The wafers W have been washed by water at the previous stage. They are covered with IPA vapor and water content adhering to them is replaced with IPA vapor. The water content can be thus completely removed from them. IPA vapor is cooled into solution drops in the upper portion of the inner region 27 of the vessel 22 in this while and returned into IPA solution 21 in the bottom of the vessel 22.

The wafers W are lifted into the upper portion 29 of the case 20 and the upper portion 29 of the case 20 is shielded from the inner region 27 of the vessel 22 (or the lower portion 27 of the case 20) by the shutter 40. The lamps 41 are turned on and dry nitrogen gas is blown to the wafers W through the filters 34. The upper portion 29 of the case 20 is exhausted this time by the exhaust device 47. The down flow of dry nitrogen gas can be thus created in the upper portion 29 of the case 20. IPA adhering to the wafers W can be thus vaporized and the wafers W can be dried. When this drying of wafers W is finished, the top lids 28 are again opened and the wafers are carried out of the case 20.

According to the above-described substrate drying apparatus 7i, the down flow of dry gas is created in the upper portion 29 of the case 20. IPA vapor can be thus prevented from entering from the upper portion 29 of the case 20 into the lower portion 27 thereof (or the inside of the vessel 22). This enables a plurality of wafers W to be dried for a shorter time and with a higher reliability to thereby enhance the throughput to a greater extent.

Further, IPA vapor cannot be leaked outside the case 20 to thereby enhance the safety of the system to a greater extent.

Still further, clean dry gas can be introduced into the upper portion 29 of the case 20 through the filters 34 to thereby prevent dusts and particles from adhering to those wafers W which have been cleaned.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A substrate drying apparatus comprising
a vessel in which a drying solution is contained;
a chamber having a top and bottom enclosing the vessel;
means for heating the drying solution into vapor in the chamber in order to form a vapor-processing region where substrates wetted with a washing solution are processed with the vapor;
means for carrying the wet substrates into the vapor-processing region in the vessel;
means located above the vapor-processing region in the vessel to cool and condense the vaporized drying solution into solution drops;
means, located on the top of the chamber, for supplying gas into the chamber;
means, located below said gas supplying means, for exhausting the chamber; and
a drying region formed between the gas supplying means and,
wherein a gas downstream is formed in said drying region by said gas supply means and said exhaust means, said downstream serving to remove the drying solution attached to said substrate and to prevent the vaporized drying solution from being released from the vessel.

2. The substrate drying apparatus according to claim 1, further comprising top lid means by which the open top of the chamber is opened and closed.

3. The substrate drying apparatus according to claim 1, further comprising intermediate shutter means located between the vapor-processing region and the drying region to partition them.

4. The substrate drying apparatus according to claim 1, further comprising means for heating the substrates in the drying region of the chamber.

5. The substrate drying apparatus according to claim 1, wherein said gas supply means includes filter means for cleaning the gas supplied into the chamber.

6. The substrate drying apparatus according to claim 1, further comprising a cup member into which the substrates are received in the vessel.

7. The substrate drying apparatus according to claim 6, wherein said cup member includes drain means through which solution removed from the substrates can be drained outside.

8. The substrate drying apparatus according to claim 1, further comprising means for controlling the heating carrying, cooling and gas-flow generating means.

9. The substrate drying apparatus according to claim 1, wherein said exhaust means comprises slits formed in both side walls of the chamber, said slits extending in a direction in which the substrates are arranged on a boat.

10. The substrate drying apparatus according to claim 1, wherein said drying solution is isopropyl alcohol and water content adhering to the substrates can be removed from them by replacing the water content with isopropyl alcohol vapor.

11. The substrate drying apparatus according to claim 1, wherein said gas-flow generating means includes means for supplying gas into the chamber and exhausting the chamber.

12. The substrate drying apparatus according to claim 1, wherein said cooling means includes a circulator for circulating a coolant.

13. The substrate drying apparatus according to claim 1, further comprising:
top lid means by which the open top of the chamber is opened and closed;
a cup member into which the substrates are received in the vessel; and
wherein the distance between the cup and top lid means is in a range of 400–600 millimeters.

* * * * *